United States Patent
Nam et al.

(10) Patent No.: US 11,804,707 B2
(45) Date of Patent: Oct. 31, 2023

(54) SYSTEM-IN-PACKAGE AND ELECTRONIC MODULE INCLUDING THE SAME

(71) Applicant: Samsung Display Co., Ltd., Yongin-Si (KR)

(72) Inventors: Wijin Nam, Cheonan-si (KR); Seunghwan Cheong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 211 days.

(21) Appl. No.: 17/320,267

(22) Filed: May 14, 2021

(65) Prior Publication Data
US 2021/0391713 A1    Dec. 16, 2021

(30) Foreign Application Priority Data
Jun. 15, 2020 (KR) .......................... 10-2020-0072494

(51) Int. Cl.
*H02H 9/00* (2006.01)
*H01L 21/66* (2006.01)
*H05K 1/18* (2006.01)
*H01L 25/18* (2023.01)

(52) U.S. Cl.
CPC .............. *H02H 9/005* (2013.01); *H01L 22/20* (2013.01); *H05K 1/181* (2013.01); *H01L 25/18* (2013.01); *H05K 1/189* (2013.01)

(58) Field of Classification Search
CPC .......... H05K 1/02; H05K 1/0259; H05K 1/18; H05K 1/181; H02H 1/00; H02H 9/04; H02H 9/005; H02H 7/16; H01L 23/60–62; H01L 23/49811

USPC ................................ 361/111–120, 127, 156
See application file for complete search history.

(56) References Cited

U.S. PATENT DOCUMENTS

| | | | |
|---|---|---|---|
| 8,027,138 B2 | 9/2011 | Maggiolino | |
| 8,150,351 B2 | 4/2012 | Shah et al. | |
| 11,251,609 B2* | 2/2022 | Chu | ........................ G21J 1/00 |
| 2008/0121988 A1* | 5/2008 | Mallikararjunaswamy | ................ H01L 27/0727 257/E21.135 |
| 2008/0310065 A1* | 12/2008 | Ho | ...................... H01L 27/0676 361/91.5 |
| 2009/0141414 A1* | 6/2009 | Hsu | ........................ H02H 9/005 361/56 |
| 2011/0013435 A1* | 1/2011 | Lee | ........................ G09G 3/296 363/126 |

(Continued)

FOREIGN PATENT DOCUMENTS

| | | |
|---|---|---|
| CN | 200941656 Y | 8/2007 |
| KR | 10-1407273 B1 | 6/2014 |
| KR | 10-1770729 B1 | 9/2017 |

*Primary Examiner* — Tuan T Dinh
(74) *Attorney, Agent, or Firm* — Innovation Counsel LLP

(57) ABSTRACT

A system-in-package includes a function circuit and a protection circuit that protects the function circuit by preventing an instantaneous transient voltage from being applied to the function circuit. Here, the protection circuit includes a TVS diode and a capacitor. The TVS diode includes an anode that receives a ground voltage and a cathode that is connected to a first external connection terminal. The capacitor includes a first terminal that is connected to a second external connection terminal electrically separated from the first external connection terminal and a second terminal that receives the ground voltage.

20 Claims, 5 Drawing Sheets

(56) References Cited

U.S. PATENT DOCUMENTS

| | | | |
|---|---|---|---|
| 2011/0069419 A1* | 3/2011 | Su | G02F 1/136204 |
| | | | 361/56 |
| 2014/0198417 A1* | 7/2014 | Wang | H03H 7/1708 |
| | | | 361/56 |
| 2019/0123554 A1* | 4/2019 | Nakaiso | H01F 17/0013 |
| 2020/0059228 A1* | 2/2020 | Parthasarathy | H03K 17/102 |
| 2020/0119626 A1* | 4/2020 | Zhang | H02K 7/14 |

* cited by examiner

SYSTEM-IN-PACKAGE AND ELECTRONIC MODULE INCLUDING THE SAME

CROSS-REFERENCE TO RELATED APPLICATION

This application claims priority under 35 USC § 119 to Korean Patent Application No. 10-2020-0072494 filed on Jun. 15, 2020 in the Korean Intellectual Property Office (KIPO), the entire disclosure of which is incorporated herein by reference.

BACKGROUND

1. Field

Embodiments generally relate to an electronic module. More particularly, embodiments of the present disclosure relate to a system-in-package including a function circuit and a protection circuit for protecting the function circuit from an instantaneous transient voltage and an electronic module including the system-in-package.

2. Description of the Related Art

Recently, in manufacturing an electronic device, a system-in-package (SIP) in which function circuits are implemented as individual chips and combined into one package has been widely used. Here, the system-in-package may include a protection circuit that prevents an instantaneous transient voltage from being applied to the function circuit to protect the function circuit from the instantaneous transient voltage generated by electrostatic discharge and the like in the electronic device, and the protection circuit may include a transient voltage suppression (TVS) diode and a capacitor connected in parallel between a conductive line connected to the function circuit and a ground voltage line that transmits a ground voltage. Accordingly, when the instantaneous transient voltage is applied to the conductive line connected to the function circuit due to the electrostatic discharge and the like in the electronic device, the TVS diode discharges a surge current flowing through the conductive line connected to the function circuit to the ground voltage line so that the function circuit may be protected. In manufacturing the electronic device, a test for the system-in-package may be performed before the system-in-package is mounted on a printed circuit board (e.g., a flexible printed circuit board). However, in a conventional system-in-package, since the TVS diode and the capacitor are connected in parallel between the conductive line connected to the function circuit and the ground voltage line (i.e., a cathode of the TVS diode and a first terminal of the capacitor are electrically connected, and an anode of the TVS diode and a second terminal of the capacitor are electrically connected), a test tact time may increase due to an attenuation vibration of a reverse current flowing through the TVS diode when a test for the TVS diode is performed and a capacitance measurement error may occur due to a leakage current flows through the TVS diode when a test for the capacitor is performed.

SUMMARY

Some embodiments provide a system-in-package including a function circuit and a protection circuit for protecting the function circuit by preventing an instantaneous transient voltage from being applied to the function circuit, where the system-in-package can prevent an effect of a capacitor (i.e., a test tact time may not be delayed) when a test for a TVS diode is performed and can prevent an effect of the TVS diode (i.e., a capacitance measurement error may not occur) when a test for the capacitor is performed.

Some embodiments provide an electronic module having high stability (or high reliability) against electrostatic discharge by including the system-in-package.

According to an aspect of embodiments, a system-in-package may include a function circuit and a protection circuit configured to protect the function circuit by preventing an instantaneous transient voltage from being applied to the function circuit. Here, the protection circuit may include a transient voltage suppression (TVS) diode including an anode that receives a ground voltage and a cathode that is connected to a first external connection terminal and a capacitor including a first terminal that is connected to a second external connection terminal electrically separated from the first external connection terminal and a second terminal that receives the ground voltage.

In embodiments, the cathode of the TVS diode and the first terminal of the capacitor may be electrically connected via a conductive pattern in a printed circuit board that is located externally to the system-in-package.

In embodiments, the printed circuit board may include a third external connection terminal and a fourth external connection terminal that are electrically connected through the conductive pattern. In addition, the third external connection terminal and the fourth external connection terminal may be electrically connected to the first external connection terminal and the second external connection terminal, respectively after both a first test for the TVS diode and a second test for the capacitance are performed.

In embodiments, the first external connection terminal, the second external connection terminal, the third external connection terminal, and the fourth external connection terminal may be implemented as solder balls.

In embodiments, the first test may be performed by measuring a reverse current flowing through the TVS diode when a first test voltage is applied via the first external connection terminal.

In embodiments, the first test voltage may be greater than or equal to a breakdown voltage of the TVS diode.

In embodiments, the second test may be performed by measuring a capacitance of the capacitor when a second test voltage is applied via the second external connection terminal.

In embodiments, the second test voltage may be greater than or equal to a reverse standoff voltage of the TVS diode.

In embodiments, when both the reverse current flowing through the TVS diode and the capacitance of the capacitor fall within a predetermined range, the first external connection terminal may be connected to the third external connection terminal and the second external connection terminal may be connected to the fourth external connection terminal.

In embodiments, when at least one of the reverse current flowing through the TVS diode and the capacitance of the capacitor does not fall within a predetermined range, the system-in-package may be determined as a defective product.

According to an aspect of embodiments, an electronic module may include a printed circuit board and at least one system-in-package mounted on the printed circuit board and including a function circuit and a protection circuit that protects the function circuit by preventing an instantaneous transient voltage from being applied to the function circuit.

Here, the protection circuit may include a transient voltage suppression (TVS) diode including an anode that receives a ground voltage and a cathode that is connected to a first external connection terminal and a capacitor including a first terminal that is connected to a second external connection terminal electrically and physically separated from the first external connection terminal and a second terminal that receives the ground voltage.

In embodiments, the cathode of the TVS diode and the first terminal of the capacitor may be electrically connected via a conductive pattern in the printed circuit board.

In embodiments, the printed circuit board may include a third external connection terminal and a fourth external connection terminal that are electrically connected through the conductive pattern. In addition, the third external connection terminal and the fourth external connection terminal may be electrically connected to the first external connection terminal and the second external connection terminal, respectively after both a first test for the TVS diode and a second test for the capacitance are performed.

In embodiments, the first external connection terminal, the second external connection terminal, the third external connection terminal, and the fourth external connection terminal may be implemented as solder balls.

In embodiments, the first test may be performed by measuring a reverse current flowing through the TVS diode when a first test voltage is applied via the first external connection terminal.

In embodiments, the first test voltage may be greater than or equal to a breakdown voltage of the TVS diode.

In embodiments, the second test may be performed by measuring a capacitance of the capacitor when a second test voltage is applied via the second external connection terminal.

In embodiments, the second test voltage may be greater than or equal to a reverse standoff voltage of the TVS diode.

In embodiments, when both the reverse current flowing through the TVS diode and the capacitance of the capacitor fall within a predetermined range, the first external connection terminal may be connected to the third external connection terminal, and the second external connection terminal may be connected to the fourth external connection terminal.

In embodiments, when at least one of the reverse current flowing through the TVS diode and the capacitance of the capacitor does not fall within a predetermined range, the system-in-package may be determined as a defective product.

Therefore, a system-in-package according to embodiments may include a function circuit and a protection circuit that protects the function circuit by preventing an instantaneous transient voltage from being applied to the function circuit. Here, the system-in-package may prevent an effect of a capacitor (i.e., a test tact time may not be delayed) when a first test for a TVS diode is performed and may prevent an effect of the TVS diode (i.e., a capacitance measurement error may not occur) when a second test for the capacitor is performed by having a structure in which the protection circuit includes the TVS diode, which includes an anode that receives a ground voltage and a cathode that is connected to a first external connection terminal, and the capacitor, which includes a first terminal that is connected to a second external connection terminal electrically separated from the first external connection terminal and a second terminal that receives the ground voltage, and the cathode of the TVS diode and the first terminal of the capacitor are electrically connected via a printed circuit board after both the first test for the TVS diode and the second test for the capacitor are performed.

In addition, an electronic module according to embodiments may have high stability (or high reliability) against electrostatic discharge by including the system-in-package.

However, effects of the present disclosure are not limited to the above-described effects, and thus the effects may be variously extended without departing from the spirit and scope of the present disclosure.

BRIEF DESCRIPTION OF THE DRAWINGS

Illustrative, non-limiting embodiments will be more clearly understood from the following detailed description in conjunction with the accompanying drawings.

DETAILED DESCRIPTION OF THE EMBODIMENTS

Hereinafter, embodiments of the present disclosure will be explained in detail with reference to the accompanying drawings.

Figure 1:
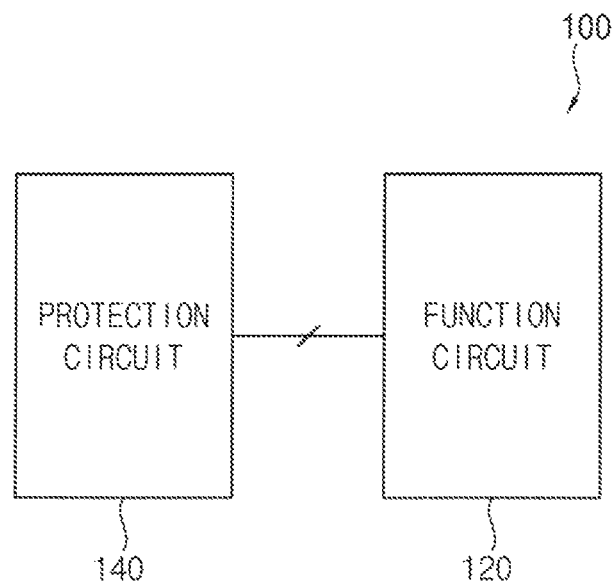
FIG. 1 is a block diagram illustrating a system-in-package according to embodiments.
Figure 2:
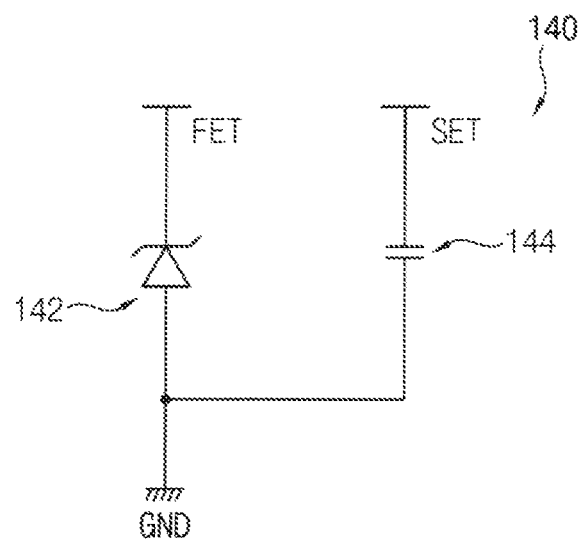
FIG. 2 is a diagram illustrating a protection circuit included in the system-in-package of FIG. 1.
Figure 3:
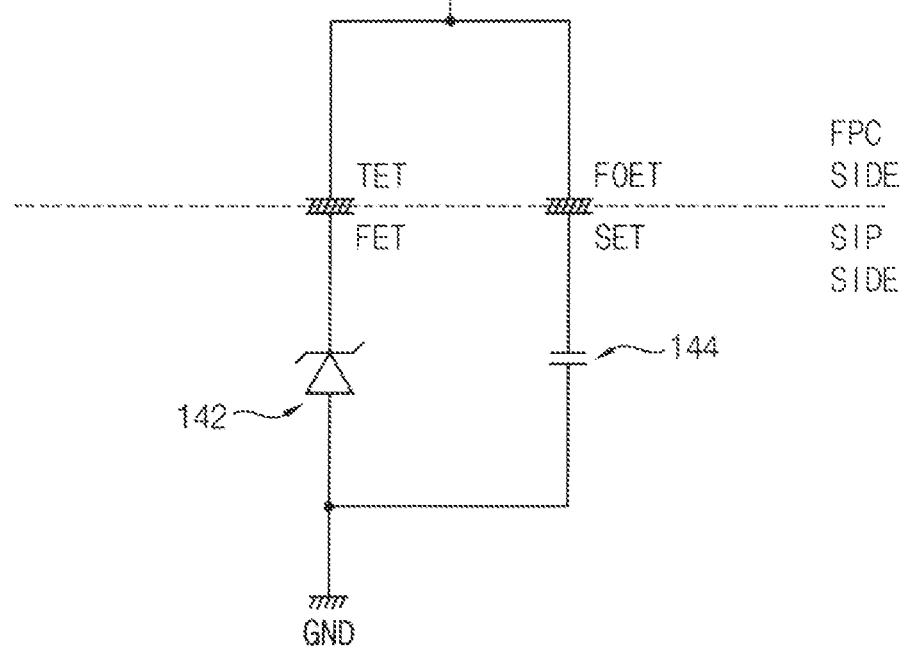
FIG. 3 is a diagram illustrating an example in which the protection circuit of FIG. 2 is connected to a printed circuit board.

FIG. 1 is a block diagram illustrating a system-in-package according to embodiments, FIG. 2 is a diagram illustrating a protection circuit included in the system-in-package of FIG. 1, and FIG. 3 is a diagram illustrating an example in which the protection circuit of FIG. 2 is connected to a printed circuit board.

Referring to FIGS. 1 to 3, the system-in-package 100 may include a function circuit 120 and a protection circuit 140 connected to the function circuit 120. Although it is illustrated in FIG. 1 that the system-in-package 100 includes one function circuit 120 and one protection circuit 140, it should be understood that the system-in-package 100 may include at least one function circuit and at least one protection circuit 140.

The function circuit 120 may perform a specific function (e.g., a communication function, a display function, a memory function, and the like). For example, the function circuit 140 may be implemented by one or more integrated circuit (IC) chips. That is, the system-in-package 100 may include a plurality of IC chips in one package (e.g., a plurality of chips may be arranged or stacked in one package). The protection circuit 140 may protect the function circuit 120 by preventing an instantaneous transient voltage from being applied to the function circuit 120. For example, when an instantaneous transient voltage is applied to a conductive line connected to the function circuit 120 due to electrostatic discharge and the like in an electronic device, the protection circuit 140 may protect the function circuit 120 by discharging a surge current flowing through the conductive line connected to the function circuit 120 to a ground voltage line. Specifically, as illustrated in FIG. 2, the protection circuit 140 may include a transient voltage suppression (TVS) diode 142 including an anode that receives a ground voltage GND and a cathode that is connected to a first external connection terminal FET and a capacitor 144 including a first terminal that is connected to a second external connection terminal SET electrically separated from the first external connection terminal FET and a second terminal that receives the ground voltage GND. Here, the first external connection terminal FET and the second external connection terminal SET may be not only electrically separated from each other but also physically separated from each other within the system-in-package 100. In an embodiment, the first external connection terminal FET and the second external connection terminal SET of the system-in-package 100 may be solder balls. When the system-in-package 100 is coupled to (i.e., mounted on) a printed circuit board (FPC) that is located externally to the system-in-package 100, the solder balls in the system-in-package 100 and solder balls in the printed circuit board (FPC) may be electrically connected. For example, as illustrated in FIG. 3, the first external connection terminal FET and the second external connection terminal SET which are solder balls in the protection circuit 140 in the system-in-package 100 may be coupled to the third external connection terminal TET and the fourth external connection terminal FOET which are solder balls in the printed circuit board, respectively.

Meanwhile, the system-in-package 100 may be mounted on the printed circuit board only when the system-in-package 100 passes a defect detection test. To this end, a test for the protection circuit 140 as well as a test for the function circuit 120 may be performed. Specifically, the test for the protection circuit 140 may include a first test for the TVS diode 142 and a second test for the capacitor 144. For example, the first test for the TVS diode 142 may be performed by measuring a reverse current flowing through the TVS diode 142 when a first test voltage is applied via the first external connection terminal FET. In an embodiment, the first test voltage may be greater than or equal to a breakdown voltage of the TVS diode 142. In addition, the second test for the capacitor 144 may be performed by measuring a capacitance of the capacitor 144 when a second test voltage is applied via the second external connection terminal SET. In an embodiment, the second test voltage may be greater than or equal to a reverse standoff voltage of the TVS diode 142 (for example, the operating voltage you do not want the data or power line to exceed). Therefore, after both the first test for the TVS diode 142 and the second test for the capacitor 144 are performed, the cathode of the TVS diode 142 and the first terminal of the capacitor 144 may be electrically connected to the printed circuit board. In other words, as illustrated in FIG. 3, the printed circuit board may include a third external connection terminal TET and a fourth external connection terminal FOET, and the third external connection terminal TET and the fourth external connection terminal FOET may be electrically connected through a conductive pattern disposed in the printed circuit board. Thus, when the first external connection terminal FET and the second external connection terminal SET of the system-in-package 100 are connected to the third external connection terminal TET and the fourth external connection terminal FOET of the printed circuit board, respectively, the cathode of the TVS diode 142 and the first terminal of the capacitor 144 may be electrically connected via the conductive pattern disposed in the printed circuit board. In an embodiment, the third external connection terminal TET and the fourth external connection terminal FOET in the printed circuit board may be solder balls.

As described above, after both the first test for the TVS diode 142 and the second test for the capacitor 144 are performed, the cathode of the TVS diode 142 and the first terminal of the capacitor 144 may be electrically connected to each other via the conductive pattern in the printed circuit board. In other words, before the system-in-package 100 is mounted on the printed circuit board, the cathode of the TVS diode 142 (i.e., the first external connection terminal FET) and the first terminal of the capacitor 144 (i.e., the second external connection terminal SET) may not be electrically connected. Therefore, when the first test voltage is applied to the first external connection terminal FET of the TVS diode 142 for the first test, the first test voltage may not be applied to the capacitor 144. Hence, no noise due to the capacitor 144 may occur when the first test for the TVS diode 142 is performed. In addition, when the second test voltage is applied to the second external connection terminal SET of the capacitor 144 for the second test, the second test voltage may not be applied to the TVS diode 142. Hence, no noise due to the TVS diode 142 may occur when the second test for the capacitor 144 is performed. On the other hand, in a conventional system-in-package, the cathode of the TVS diode 142 and the first terminal of the capacitor 144 are electrically connected to each other (e.g., electrically connected to a same node) even when the conventional system-in-package is not coupled to the printed circuit board. Therefore, when the first test voltage is applied to the node as the first test for the TVS diode 142 is performed, the first test voltage is also applied to the capacitor 144. Hence, when the first test for the TVS diode 142 is performed, a noise due to an attenuation vibration of a reverse current flowing through the TVS diode 142 may occur. In addition, when the second test voltage is applied to the node to which the cathode of the TVS diode 142 and the first terminal of the capacitor 144 are commonly connected to perform the second test for the capacitor 144, the second test voltage is also applied to the cathode of the TVS diode 142. Hence, when the second test for the capacitor 144 is performed, a noise due to the TVS diode 142 (e.g., a phenomenon in which a leakage current flows through the TVS diode 142) may occurs. As a result, in the conventional system-in-package, the test tact time is delayed due to the effect of the capacitor 144 when the first test for the TVS diode 142 is performed and a capacitance measurement error occurs due to the effect of the TVS diode 142 when the second test for the capacitor 144 is performed such that the test reliability for the conventional system-in-package may be degraded. On the other hand, in the system-in-package 100 in which the cathode of the TVS diode 142 and the first terminal of the capacitor 144 are not connected to each other, when the first test for the TVS diode 142 and the second test for the capacitor 144 are performed, the test tact time delay or the capacitance measurement error does not occur such that the test reliability for the system-in-package 100 may be improved.

When the first test for the TVS diode 142 and the second test for the capacitor 144 are performed, the system-in-package 100 may be determined as a defective product and thus discarded if at least one of the reverse current flowing through the TVS diode 142 and the capacitance of the capacitor 144 is determined not to fall within a predetermined range. On the other hand, if both the reverse current flowing through the TVS diode 142 and the capacitance of the capacitor 144 fall within the predetermined range, the system-in-package 100 may be determined as a normal product and thus mounted on the printed circuit board. That is, when both the reverse current flowing through the TVS diode 142 and the capacitance of the capacitor 144 fall within the predetermined range, as illustrated in FIG. 3, the first external connection terminal FET of the system-in-package 100 may be connected to the third external connection terminal TET of the printed circuit board and the second external connection terminal SET of the system-in-package 100 may be connected to the fourth external connection terminal FOET of the printed circuit board. Therefore, after the system-in-package 100 determined as a normal product is coupled to the printed circuit board, the cathode of the TVS diode 142 and the first terminal of the capacitor 144 may be electrically connected. Thus, the protection circuit 140 included in the system-in-package 100 may operate normally (i.e., may protect the function circuit 120 from an instantaneous transient voltage generated by electrostatic discharge and the like in an electronic device). In other words, as illustrated in FIG. 3, because the cathode of the TVS diode 142 and the first terminal of the capacitor 144 are electrically connected to each other via the conductive pattern in the printed circuit board after the protection circuit is determined as a normal product, the protection circuit 140 included in the system-in-package 100 may have a structure in which the TVS diode 142 and the capacitor 144 are connected in parallel between a conductive line connected to the function circuit 120 and the ground voltage line that transfers the ground voltage GND. As a result, even when the instantaneous transient voltage is applied to the conductive line due to the electrostatic discharge and the like in the electronic device, the TVS diode 142 may discharge a surge current flowing through the conductive line to the ground voltage line through the protection circuit 140, and thus the function circuit 120 may be protected from the instantaneous transient voltage.

In brief, the system-in-package 100 may include the function circuit 120 and the protection circuit 140 that protects the function circuit 120 by preventing the instantaneous transient voltage from being applied to the function circuit 120. Here, the system-in-package 100 may prevent the effect of the capacitor 144 when the first test for the TVS diode 142 is performed, thus the test tact time may not be delayed, and may prevent the effect of the TVS diode 142 when the second test for the capacitor 144 is performed, thus the capacitance measurement error may not occur by having a structure in which the protection circuit 140 includes the TVS diode 142 which includes the anode that receives the ground voltage GND and the cathode that is connected to the first external connection terminal FET, and the capacitor 144 which includes the first terminal that is connected to the second external connection terminal SET that is not electrically connected to the first external connection terminal FET and the second terminal that receives the ground voltage GND, and the cathode of the TVS diode 142 and the first terminal of the capacitor 144 are electrically connected via the conductive pattern in the printed circuit board after both the first test for the TVS diode 142 and the second test for the capacitor 144 are performed. Thus, the system-in-package 100 may reduce a test cost by shortening the test tact time and may improve a test yield by enhancing defect detection ability (e.g., by accurately measuring the reverse current of the TVS diode 142 and the capacitance of the capacitor 144). As a result, an electronic module including the system-in-package 100 may have high stability (or high reliability) against the electrostatic discharge.

Figure 4A:
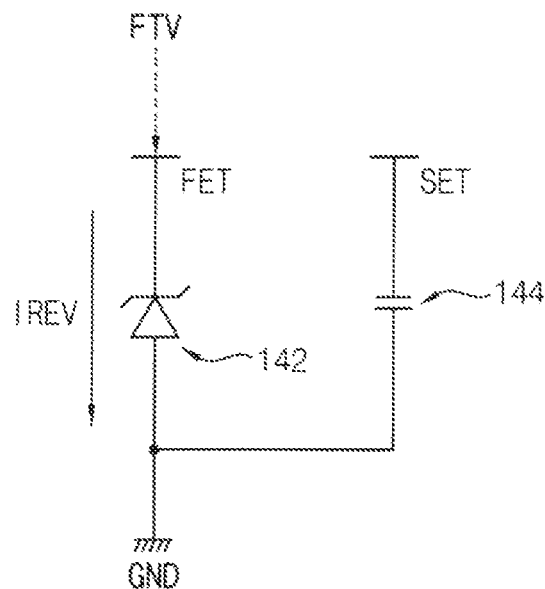
FIG. 4A is a diagram illustrating an example in which a first test for a TVS diode of a protection circuit in the system-in-package of FIG. 1 is performed.
Figure 4B:
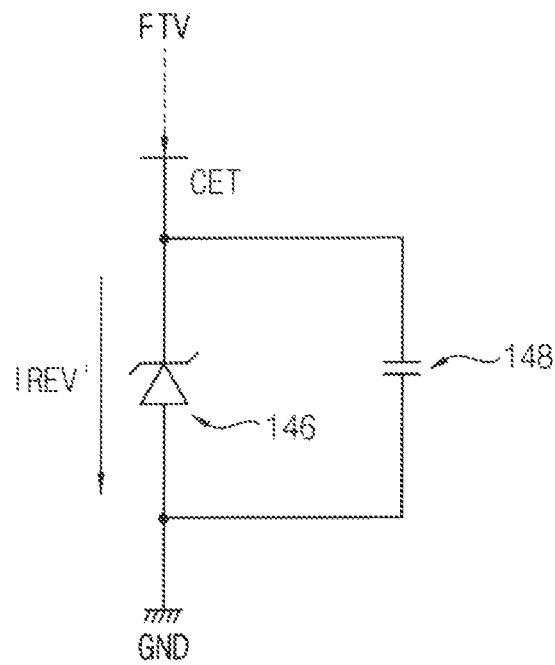
FIG. 4B is a diagram illustrating a comparative example in which a first test for a TVS diode of a protection circuit in a conventional system-in-package is performed.

FIG. 4A is a diagram illustrating an example in which a first test for a TVS diode of a protection circuit in the system-in-package of FIG. 1 is performed, and FIG. 4B is a diagram illustrating a comparative example in which a first test for a TVS diode of a protection circuit in a conventional system-in-package is performed.

Referring to FIGS. 4A and 4B, FIGS. 4A and 4B show that a difference in a test time occurs between the system-in-package 100 and the conventional system-in-package when the first test is performed on the TVS diodes 142 and 146.

Specifically, as illustrated in FIG. 4A, in the system-in-package 100, the first test for the TVS diode 142 may be performed by measuring a reverse current IREV flowing through the TVS diode 142 when the first test voltage FTV is applied via the first external connection terminal FET. In an embodiment, the first test voltage FTV may be greater than or equal to the breakdown voltage of the TVS diode 142. Here, since the first test for the TVS diode 142 is performed before the system-in-package 100 is mounted on the printed circuit board, the first external connection terminal FET and the second external connection terminal SET may be electrically separated. Accordingly, when the first test voltage FTV is applied via the first external connection terminal FET, the first test voltage FTV may not be applied to the capacitor 144. Thus, in the system-in-package 100, the effect of the capacitor 144 (e.g., a phenomenon in which a reverse current IREV flowing through the TVS diode 142 is attenuated and vibrated) may not occur when the first test for the TVS diode 142 is performed. Thereafter, when the reverse current IREV flowing through the TVS diode 142 falls within the predetermined range, the TVS diode 142 may be determined as a normal product, the system-in-package 100 may be mounted on the printed circuit board, and the first external connection terminal FET may be electrically connected to the third external connection terminal TET of the printed circuit board. On the other hand, when the reverse current IREV flowing through the TVS diode 142 does not fall within the predetermined range, the TVS diode 142 may be determined as a defective product, the system-in-package 100 may also be determined as a defective product, and thus the system-in-package 100 may be discarded.

On the other hand, as illustrated in FIG. 4B, in the conventional system-in-package, the first test for the TVS diode 146 may be performed by measuring a reverse current IREV' flowing through the TVS diode 146 when the first test voltage FTV is applied to a common connection terminal CET which is connected to the cathode of the TVS diode 146 and the first terminal of the capacitor 144. In an embodiment, the first test voltage FTV may be greater than or equal to the breakdown voltage of the TVS diode 146. Here, in the conventional system-in-package, since the cathode of the TVS diode 146 and the first terminal of the capacitor 148 are electrically connected to the same node (i.e., the common connection terminal CET), and the anode of the TVS diode 146 and the second terminal of the capacitor 148 are electrically connected to the ground voltage line that transfers the ground voltage GND, the first test voltage FTV may be commonly applied to the TVS diode 146 and the capacitor 148 when the first test voltage FTV is applied via the common connection terminal CET. Thus, in the conventional system-in-package, the effect of the capacitor 148 (e.g., a phenomenon in which the reverse current IREV' flowing through the TVS diode 146 is attenuated and vibrated) may occur when the first test for the TVS diode 146 is performed. Therefore, in the conventional system-in-package, an attenuation vibration phenomenon of a current waveform occurs due to the coupling between the TVS diode 146 and the capacitor 148. For this reason, because the reverse current IREV' flowing through the TVS diode 146 must be measured after the attenuation vibration of the reverse current IREV' flowing through the TVS diode 146 subsides, the test tact time for the first test for the TVS diode 146 may increase significantly (i.e., the test tact time may be delayed) or an measured value of the reverse current IREV' flowing through the TVS diode 146 may become inaccurate when the reverse current IREV' flowing through the TVS diode 146 is measured too early before the attenuation vibration of the reverse current IREV' flowing through the TVS diode 146 subsides.

As described above, the system-in-package 100 may include the function circuit 120 and the protection circuit 140 that protects the function circuit 120 by preventing the instantaneous transient voltage from being applied to the function circuit 120. Here, the system-in-package 100 may prevent the effect of the capacitor 144 (i.e., the test tact time may not be delayed) when the first test for the TVS diode 142 is performed and may prevent the effect of the TVS diode 142 (i.e., the capacitance measurement error may not occur) when the second test for the capacitor 144 is performed by having a structure in which the protection circuit 140 includes the TVS diode 142, which includes the anode that receives the ground voltage GND and the cathode that is connected to the first external connection terminal FET, and the capacitor 144, which includes the first terminal that is connected to the second external connection terminal SET electrically separated from the first external connection terminal FET and the second terminal that receives the ground voltage GND, and the cathode of the TVS diode 142 and the first terminal of the capacitor 144 are electrically connected via the conductive pattern in the printed circuit board after both the first test for the TVS diode 142 and the second test for the capacitor 144 are performed. In addition, when the system-in-package 100 which is determined as a normal product is coupled to (or mounted on) the printed circuit board, the cathode of the TVS diode 142 and the first terminal of the capacitor 144 may be electrically connected to each other via the conductive pattern in the printed circuit board, and thus the protection circuit 140 included in the system-in-package 100 may have a structure in which the TVS diode 142 and the capacitor 144 are connected in parallel between a conductive line connected to the function circuit 120 and a ground voltage line that transfers the ground voltage GND. Thus, when the instantaneous transient voltage is applied to the conductive line connected to the function circuit 120 due to electrostatic discharge and the like in an electronic device, the TVS diode 142 may protect the function circuit 120 by discharging a surge current flowing through the conductive line connected to the function circuit 120 to the ground voltage line that transfers the ground voltage GND. As a result, the system-in-package 100 may reduce a test cost by shortening the test tact time and may improve a test yield by enhancing defect detection ability (e.g., by accurately measuring the reverse current of the TVS diode 142 and the capacitance of the capacitor 144).

Figure 5A:
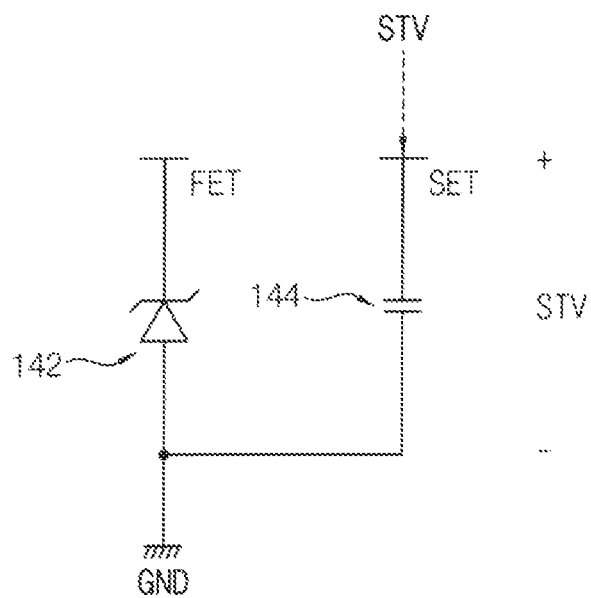
FIG. 5A is a diagram illustrating an example in which a second test for a capacitor of a protection circuit in the system-in-package of FIG. 1 is performed.
Figure 5B:
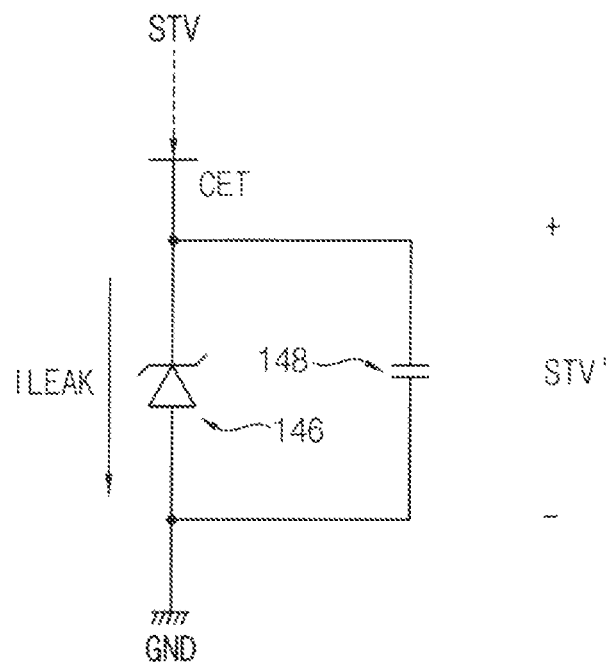
FIG. 5B is a diagram illustrating a comparative example in which a second test for a capacitor of a protection circuit in a conventional system-in-package is performed.

FIG. 5A is a diagram illustrating an example in which a second test for a capacitor of a protection circuit in the system-in-package of FIG. 1 is performed, and FIG. 5B is a diagram illustrating a comparative example in which a second test for a capacitor of a protection circuit in a conventional system-in-package is performed.

Referring to FIGS. 5A and 5B, FIGS. 5A and 5B show that a difference in a capacitance measurement value occurs between the system-in-package 100 and the conventional system-in-package when the second test is performed on the capacitors 144 and 148.

Specifically, as illustrated in FIG. 5A, in the system-in-package 100, the second test for the capacitor 144 may be performed by measuring a capacitance of the capacitor 144 when the second test voltage STV is applied via the second external connection terminal SET. In an embodiment, the second test voltage STV may be greater than or equal to the reverse standoff voltage of the TVS diode 142. Here, since the second test for the capacitor 144 is performed before the system-in-package 100 is mounted on the printed circuit board, the second external connection terminal SET and the first external connection terminal FET may be electrically separated. Accordingly, when the second test voltage STV is applied via the second external connection terminal SET, the second test voltage STV may not be applied to the TVS diode 142. Thus, in the system-in-package 100, the effect of the TVS 142 (e.g., a phenomenon in which a leakage current ILEAK flows through the TVS diode 142) may not occur when the second test for the capacitor 144 is performed. Thereafter, when the capacitance of the capacitor 144 falls within the predetermined range, the capacitor 144 may be determined as a normal product, the system-in-package 100 may be mounted on the printed circuit board, and the second external connection terminal SET may be electrically connected to the fourth external connection terminal FOET of the printed circuit board. On the other hand, when the capacitance of the capacitor 144 does not fall within the predetermined range, the capacitor 144 may be determined as a defective product, the system-in-package 100 may also be determined as a defective product, and thus the system-in-package 100 may be discarded.

On the other hand, as illustrated in FIG. 5B, in the conventional system-in-package, the second test for the capacitor 148 may be performed by measuring a capacitance of the capacitor 148 when the second test voltage STV is applied via a common connection terminal CET which is connected to the cathode of the TVS diode 142 and the first terminal of the capacitor 144. In an embodiment, the second test voltage STV may be greater than or equal to the reverse standoff voltage of the TVS diode 146. Here, in the conventional system-in-package, since the TVS diode 146 and the capacitor 148 are connected in parallel (i.e., the cathode of the TVS diode 146 and the first terminal of the capacitor 148 are electrically connected at the common node (i.e., the common connection terminal CET), and the anode of the TVS diode 146 and the second terminal of the capacitor 148 are electrically connected to the ground voltage line that transfers the ground voltage GND), the second test voltage STV may be commonly applied to the TVS diode 146 and the capacitor 148 because the second test voltage STV is applied via the common connection terminal CET which is connected to the cathode of the TVS diode 142 and the first terminal of the capacitor 144. Thus, in the conventional system-in-package, the effect of the TVS diode 146 (e.g., a phenomenon in which the leakage current ILEAK flows through the TVS diode 146) may occur when the second test for the capacitor 148 is performed. Therefore, in the conventional system-in-package because a voltage change occurs due to the coupling between the TVS diode 146 and the capacitor 148, a specific voltage STV' which is different from the second test voltage STV may be applied across both ends of the capacitor 148 even when the second test voltage STV is applied via the common connection terminal CET, and thus the capacitance of the capacitor 148 that is to be measured based on the voltage STV' may become inaccurate. Particularly, when the second test voltage STV is less than the reverse standoff voltage of the TVS diode 146, it may be negligible because the leakage current ILEAK does not flow through the TVS diode 146. However, when the second test voltage STV is greater than or equal to the reverse standoff voltage of the TVS diode 146, an error may occur in the capacitance measurement value of the capacitor 148 because the leakage current ILEAK flows through the TVS diode 146.

As described above, the system-in-package 100 may include the function circuit 120 and the protection circuit 140 that protects the function circuit 120 by preventing the instantaneous transient voltage from being applied to the function circuit 120. Here, the system-in-package 100 may prevent the effect of the capacitor 144 (i.e., the test tact time may not be delayed) when the first test for the TVS diode 142 is performed and may prevent the effect of the TVS diode 142 (i.e., the capacitance measurement error may not occur) when the second test for the capacitor 144 is performed by having a structure in which the protection circuit 140 includes the TVS diode 142 which includes the anode that receives the ground voltage GND and the cathode that is connected to the first external connection terminal FET, and the capacitor 144 which includes the first terminal that is connected to the second external connection terminal SET electrically separated from the first external connection terminal FET and the second terminal that receives the ground voltage GND, and the cathode of the TVS diode 142 and the first terminal of the capacitor 144 are electrically connected via the conductive pattern in the printed circuit board after both the first test for the TVS diode 142 and the second test for the capacitor 144 are performed. In addition, when the system-in-package 100 which is determined as a normal product is coupled to (or mounted on) the printed circuit board, the cathode of the TVS diode 142 and the first terminal of the capacitor 144 may be electrically connected to each other via the conductive pattern in the printed circuit board, and thus the protection circuit 140 included in the system-in-package 100 may have a structure in which the TVS diode 142 and the capacitor 144 are connected in parallel between a conductive line connected to the function circuit 120 and a ground voltage line that transfers the ground voltage GND. Thus, when the instantaneous transient voltage is applied to the conductive line connected to the function circuit 120 due to electrostatic discharge and the like in an electronic device, the TVS diode 142 may protect the function circuit 120 by discharging a surge current flowing through the conductive line connected to the function circuit 120 to the ground voltage line that transfers the ground voltage GND. As a result, the system-in-package 100 may reduce a test cost by shortening the test tact time and may improve a test yield by enhancing defect detection ability (e.g., by accurately measuring the reverse current of the TVS diode 142 and the capacitance of the capacitor 144).

Figure 6:
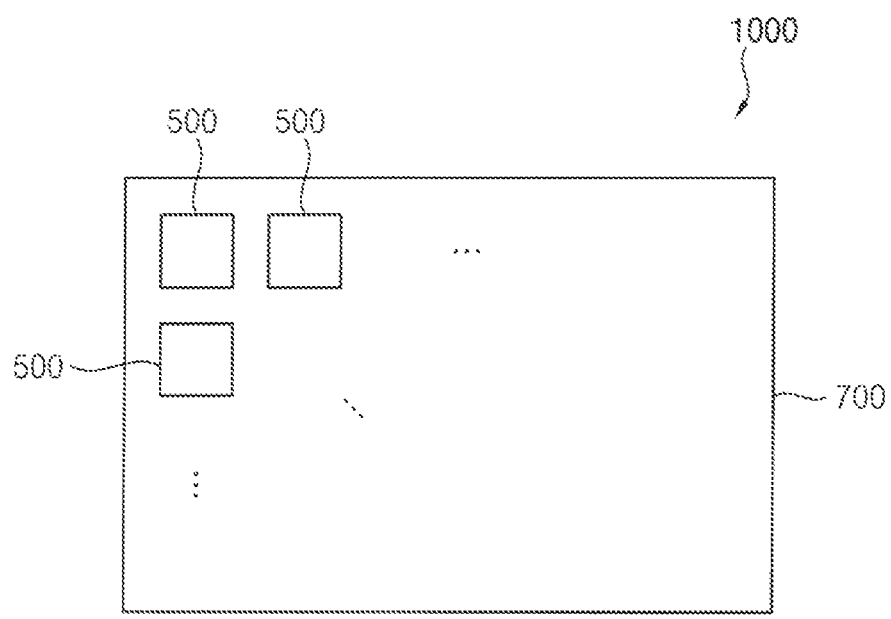
FIG. 6 is a block diagram illustrating an electronic module according to embodiments.
Figure 7:
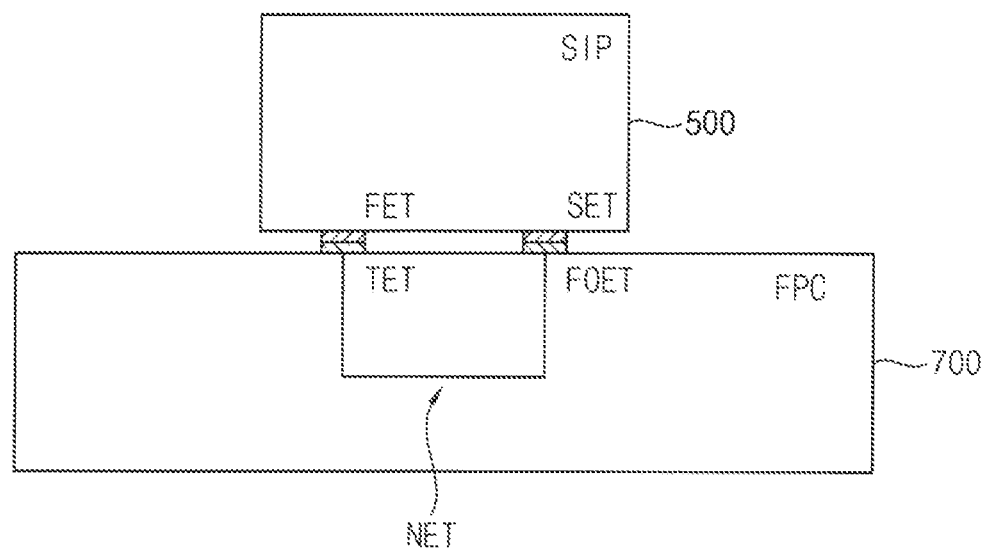
FIG. 7 is a diagram illustrating an example in which a system-in-package is mounted on a printed circuit board in the electronic module of FIG. 6.
Figure 8:
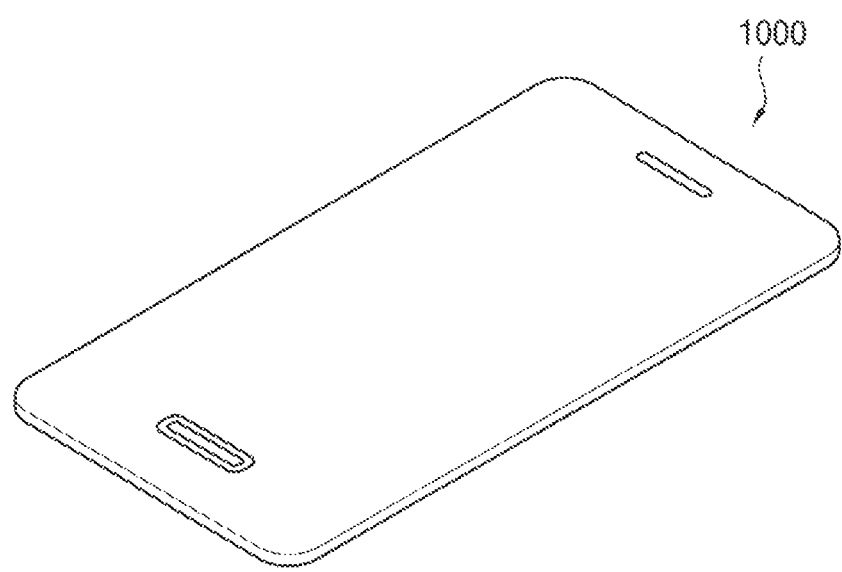
FIG. 8 is a diagram illustrating an example of a smart phone including the electronic module of FIG. 6.

FIG. 6 is a block diagram illustrating an electronic module according to embodiments, FIG. 7 is a diagram illustrating an example in which a system-in-package is mounted on a printed circuit board in the electronic module of FIG. 6, and FIG. 8 is a diagram illustrating an example of a smart phone including the electronic module of FIG. 6.

Referring to FIGS. 6 to 8, the electronic module 1000 may include a printed circuit board 700 and at least one system-in-package 500 mounted on the printed circuit board 700. In an embodiment, as illustrated in FIG. 8, the electronic module 1000 may be included in an electronic device such as a smart phone and the like. However, the electronic device is not limited thereto. For example, the electronic device may be implemented as a cellular phone, a video phone, a smart pad, a smart watch, a tablet PC, a car navigation system, a computer monitor, a laptop, a head mounted display (HMD) device, and the like.

At least one system-in-package 500 may be mounted on the printed circuit board 700 (or referred to as a package substrate). For example, the printed circuit board 700 may be a flexible printed circuit (FPC) board. However, the printed circuit board 700 is not limited thereto. The system-in-package 500 may include a function circuit and a protection circuit that protects the function circuit by preventing an instantaneous transient voltage from being applied to the function circuit. For example, the electronic device including the electronic module 1000 may include a processor, a memory device, a display device, and the like. The processor may perform various computing functions. The processor may be a micro-processor, a central processing unit (CPU), an application processor (AP), and the like. The processor may be coupled to other components via an address bus, a control bus, a data bus, and the like. Further, the processor may be coupled to an extended bus such as a peripheral component interconnection (PCI) bus. The memory device may store data for operations of the electronic device. The display device may display an image corresponding to visual information of the electronic device. However, the present disclosure is not limited thereto. The protection circuit may protect the function circuit by preventing the instantaneous transient voltage from being applied to the function circuit. For example, when the instantaneous transient voltage is applied to a conductive line connected to the function circuit due to electrostatic discharge and the like in the electronic device, the protection circuit may protect the function circuit by discharging a surge current flowing through the conductive line connected to the function circuit to a ground voltage line.

Specifically, the protection circuit may include a TVS diode that includes an anode receiving a ground voltage and a cathode connected to a first external connection terminal FET and a capacitor that includes a first terminal connected to a second external connection terminal SET that is physically and electrically separated from the first external connection terminal FET and a second terminal receiving the ground voltage. In other words, before both a first test for the TVS diode and a second test for the capacitor are performed, the cathode of the TVS diode and the first terminal of the capacitor may not be electrically connected. Thereafter, when both the first test for the TVS diode and the second test for the capacitor are performed and when both a reverse current flowing through the TVS diode and a capacitance of the capacitor fall within a predetermined range, the first external connection terminal FET of the system-in-package 500 may be connected to the third external connection terminal TET of the printed circuit board 700 and the second external connection terminal SET of the system-in-package 500 may be connected to the fourth external connection terminal FOET of the printed circuit board 700. Here, as illustrated in FIG. 7, the third external connection terminal TET and the fourth external connection terminal FOET may be electrically connected to each other via a conductive pattern in the printed circuit board 700. Thus, the cathode of the TVS diode and the first terminal of the capacitor may be electrically connected (i.e., indicated by NET) via the printed circuit board 700. On the other hand, when both the first test for the TVS diode and the second test for the capacitor are performed and when at least one of the reverse current flowing through the TVS diode and the capacitance of the capacitor does not fall within the predetermined range, the system-in-package may be determined as a defective product and thus discarded. As a result, a test for the system-in-package 500 can be accurately and quickly performed, and the electronic module 1000 including the system-in-package 500 that has passed the test can have high stability (or high reliability) against electrostatic discharge. Since these are described above, duplication description related thereto will not be repeated.

The present disclosure may be applied to an electronic module including a system-in-package. For example, the present disclosure may be applied to a smart phone, a cellular phone, a video phone, a smart pad, a smart watch, a tablet PC, a car navigation system, a television, a computer monitor, a laptop, a digital camera, a head mounted display (HMD) device, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present disclosure. Accordingly, all such modifications are intended to be included within the scope of the present disclosure as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A system-in-package comprising:
   a function circuit; and
   a protection circuit configured to protect the function circuit by preventing an instantaneous transient voltage from being applied to the function circuit,
   wherein the protection circuit includes:
   a transient voltage suppression (TVS) diode including an anode that receives a ground voltage and a cathode that is connected to a first external connection terminal; and
   a capacitor including a first terminal that is connected to a second external connection terminal which is electrically isolated from the first external connection terminal and a second terminal that receives the ground voltage.

2. The system-in-package of claim 1, wherein the cathode of the TVS diode and the first terminal of the capacitor are electrically connected via a conductive pattern in a printed circuit board that is located externally to the system-in-package.

3. The system-in-package of claim 2, wherein the printed circuit board includes a third external connection terminal and a fourth external connection terminal that are electrically connected through the conductive pattern, and
   wherein the third external connection terminal and the fourth external connection terminal are electrically connected to the first external connection terminal and the second external connection terminal, respectively after both a first test for the TVS diode and a second test for the capacitance are performed.

4. The system-in-package of claim 3, wherein the first external connection terminal, the second external connection terminal, the third external connection terminal, and the fourth external connection terminal are implemented as solder balls.

5. The system-in-package of claim 3, wherein the first test is performed by measuring a reverse current flowing through the TVS diode when a first test voltage is applied via the first external connection terminal.

6. The system-in-package of claim 5, wherein the first test voltage is greater than or equal to a breakdown voltage of the TVS diode.

7. The system-in-package of claim 5, wherein the second test is performed by measuring a capacitance of the capacitor when a second test voltage is applied via the second external connection terminal.

8. The system-in-package of claim 7, wherein the second test voltage is greater than or equal to a reverse standoff voltage of the TVS diode.

9. The system-in-package of claim 7, wherein, when both the reverse current flowing through the TVS diode and the capacitance of the capacitor fall within a predetermined range, the first external connection terminal is connected to the third external connection terminal and the second external connection terminal is connected to the fourth external connection terminal.

10. The system-in-package of claim 7, wherein, when at least one of the reverse current flowing through the TVS diode and the capacitance of the capacitor does not fall within a predetermined range, the system-in-package is determined as a defective product.

11. An electronic module comprising:
    a printed circuit board; and
    at least one system-in-package mounted on the printed circuit board and including a function circuit and a protection circuit that protects the function circuit by preventing an instantaneous transient voltage from being applied to the function circuit,
    wherein the protection circuit includes:
    a transient voltage suppression (TVS) diode including an anode that receives a ground voltage and a cathode that is connected to a first external connection terminal; and
    a capacitor including a first terminal that is connected to a second external connection terminal which is electrically isolated from the first external connection terminal and a second terminal that receives the ground voltage.

12. The electronic module of claim 11, wherein the cathode of the TVS diode and the first terminal of the capacitor are electrically connected via a conductive pattern in the printed circuit board.

13. The electronic module of claim 12, wherein the printed circuit board includes a third external connection terminal and a fourth external connection terminal that are electrically connected through the conductive pattern, and
    wherein the third external connection terminal and the fourth external connection terminal are electrically connected to the first external connection terminal and the second external connection terminal, respectively after both a first test for the TVS diode and a second test for the capacitance are performed.

14. The electronic module of claim 13, wherein the first external connection terminal, the second external connection terminal, the third external connection terminal, and the fourth external connection terminal are implemented as solder balls.

15. The electronic module of claim 13, wherein the first test is performed by measuring a reverse current flowing through the TVS diode when a first test voltage is applied via the first external connection terminal.

16. The electronic module of claim 15, wherein the first test voltage is greater than or equal to a breakdown voltage of the TVS diode.

17. The electronic module of claim 15, wherein the second test is performed by measuring a capacitance of the capacitor when a second test voltage is applied via the second external connection terminal.

18. The electronic module of claim 17, wherein the second test voltage is greater than or equal to a reverse standoff voltage of the TVS diode.

19. The electronic module of claim 17, wherein, when both the reverse current flowing through the TVS diode and the capacitance of the capacitor fall within a predetermined range, the first external connection terminal is connected to the third external connection terminal, and the second external connection terminal is connected to the fourth external connection terminal.

20. The electronic module of claim 17, wherein, when at least one of the reverse current flowing through the TVS diode and the capacitance of the capacitor does not fall within a predetermined range, the system-in-package is determined as a defective product.

* * * * *